United States Patent
Kaneda

(10) Patent No.: US 10,797,218 B2
(45) Date of Patent: Oct. 6, 2020

(54) SUBSTRATE, METHOD FOR MANUFACTURING SUBSTRATE, AND ELASTIC WAVE DEVICE

(71) Applicant: Murata Manufacturing Co., Ltd., Nagaokakyo-shi, Kyoto-fu (JP)

(72) Inventor: Akio Kaneda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 582 days.

(21) Appl. No.: 15/638,421

(22) Filed: Jun. 30, 2017

(65) Prior Publication Data

US 2017/0309807 A1    Oct. 26, 2017

Related U.S. Application Data

(63) Continuation of application No. PCT/JP2016/051005, filed on Jan. 14, 2016.

(30) Foreign Application Priority Data

Jan. 16, 2015    (JP) .................. 2015-006767

(51) Int. Cl.
*H01L 41/083*    (2006.01)
*H03H 9/05*    (2006.01)
(Continued)

(52) U.S. Cl.
CPC .......... *H01L 41/083* (2013.01); *H01L 41/277* (2013.01); *H01L 41/312* (2013.01);
(Continued)

(58) Field of Classification Search
CPC . H01L 41/053; H01L 41/083; H03H 9/02031; H03H 9/02559; H03H 9/02574;
(Continued)

(56) References Cited

U.S. PATENT DOCUMENTS 6,224,703 B1    5/2001    Yamasaki et al.
6,443,351 B1    9/2002    Huang et al.
(Continued)

FOREIGN PATENT DOCUMENTS

JP    59-99794 A    6/1984
JP    05-21958 A    1/1993
(Continued)

OTHER PUBLICATIONS

Official Communication issued in Japanese Patent Application No. 2016-569509, dated Mar. 13, 2018.
(Continued)

*Primary Examiner* — Derek J Rosenau
(74) *Attorney, Agent, or Firm* — Keating & Bennett, LLP

(57) ABSTRACT

A substrate includes a substrate main body that includes a first main surface and a second main surface facing the first main surface. First electrode lands are disposed inside a recessed portion of the first main surface of the substrate main body. Second electrode lands are disposed in a region outside the recessed portion. The first electrode land and the second electrode land are connected to different electric potentials.

20 Claims, 5 Drawing Sheets

(51) Int. Cl.
*H05K 1/03* (2006.01)
*H05K 3/34* (2006.01)
*H01L 41/277* (2013.01)
*H01L 41/312* (2013.01)
*H03H 9/02* (2006.01)
*H03H 9/125* (2006.01)

(52) U.S. Cl.
CPC .... *H03H 9/02031* (2013.01); *H03H 9/02559* (2013.01); *H03H 9/02574* (2013.01); *H03H 9/059* (2013.01); *H03H 9/125* (2013.01); *H05K 1/0306* (2013.01); *H05K 3/3436* (2013.01); *H05K 2201/094* (2013.01); *Y02P 70/50* (2015.11)

(58) Field of Classification Search
CPC .... H03H 9/059; H03H 9/1014; H03H 9/1021; H03H 9/15; H03H 9/17; H03H 9/19
USPC ........................................................ 310/348
See application file for complete search history.

(56) References Cited

U.S. PATENT DOCUMENTS

| | | | |
|---|---|---|---|
| 2003/0000067 A1 | 1/2003 | Hori | |
| 2004/0135471 A1* | 7/2004 | Arai | H03H 9/02007 310/324 |
| 2006/0012269 A1* | 1/2006 | Oda | H03H 9/177 310/348 |
| 2007/0120614 A1* | 5/2007 | Moriya | H03H 9/0547 331/158 |
| 2007/0273250 A1* | 11/2007 | Naruse | H03H 9/0547 310/348 |
| 2012/0223622 A1* | 9/2012 | Otsuki | H03H 9/02 310/344 |
| 2014/0292151 A1* | 10/2014 | Kondo | H03H 9/1014 310/343 |
| 2014/0332956 A1 | 11/2014 | Zheng et al. | |

FOREIGN PATENT DOCUMENTS

| | | |
|---|---|---|
| JP | 11-284100 A | 10/1999 |
| JP | 2000-077970 A | 3/2000 |
| JP | 2004-153579 A | 5/2004 |
| JP | 2012-186633 A | 9/2012 |

OTHER PUBLICATIONS

Official Communication issued in International Patent Application No. PCT/JP2016/051005, dated Apr. 5, 2016.

* cited by examiner

SUBSTRATE, METHOD FOR MANUFACTURING SUBSTRATE, AND ELASTIC WAVE DEVICE

CROSS REFERENCE TO RELATED APPLICATIONS

This application claims the benefit of priority to Japanese Patent Application No. 2015-006767 filed on Jan. 16, 2015 and is a Continuation Application of PCT Application No. PCT/JP2016/051005 filed on Jan. 14, 2016. The entire contents of each application are hereby incorporated herein by reference.

BACKGROUND OF THE INVENTION

1. Field of the Invention

The present invention relates to a substrate including electrode lands on a main surface, a method for manufacturing the substrate, and an elastic wave device.

2. Description of the Related Art

Conventionally, junction structures between electronic component elements and packaging substrates with bumps are widely used. For example, according to Japanese Unexamined Patent Application Publication No. 2012-186633, electrode lands for signal-side terminals and electrode lands for ground terminals are disposed on a die-attachment surface of a packaging substrate. The electrode lands for signal-side terminals and the electrode lands for ground terminals are bonded to respective bumps disposed on a surface acoustic wave element.

There is a possibility that, in the substrate disclosed in Japanese Unexamined Patent Application Publication No. 2012-186633, a stray capacitance exists between each of the electrode lands for signal-side terminals and each of the electrode lands for ground terminals. The stray capacitance affects a filter characteristic, for example, in the case of a surface acoustic wave filter. The distance between the electrode lands can be increased to decrease the stray capacitance.

However, the increase in the distance between the electrode lands increases the size of an entire surface acoustic wave device.

Alternatively, the area of each electrode land can be decreased to decrease the stray capacitance. There is, however, a possibility that the decrease in the area of each electrode land decreases a bonding strength that each bump provides.

SUMMARY OF THE INVENTION

Preferred embodiments of the present invention provide substrates that enable stray capacitance between electrode lands to be decreased and that achieves decreases in size, methods for manufacturing the substrates, and elastic wave devices including the substrates.

A substrate according to a preferred embodiment of the present invention includes a substrate main body that includes a first main surface including a recessed portion and a second main surface facing the first main surface, a first electrode land disposed inside the recessed portion of the first main surface of the substrate main body, and a second electrode land that is disposed on the first main surface of the substrate main body outside the recessed portion and that is connected to an electric potential different from an electric potential of the first electrode land.

In a substrate according to a preferred embodiment of the present invention, the substrate main body is defined by a multilayer substrate including a plurality of substrate layers. In this case, various circuits and elements are able to be provided in the multilayer substrate.

In a substrate according to another preferred embodiment of the present invention, the recessed portion is preferably provided inside an outer periphery of the substrate, and a region that is not recessed is provided between the recessed portion and the outer periphery. In this case, the region that is not recessed is provided at an outer side portion of the first main surface of the substrate main body, and a bonding strength that a bump provides between the second electrode land and an electronic component element is able to be sufficiently increased.

In a substrate according to another preferred embodiment of the present invention, an area of the first electrode land is preferably smaller than an area of the second electrode land. In this case, the stray capacitance between the first electrode land and the second electrode land is able to be further decreased.

In a substrate according to another preferred embodiment of the present invention, the substrate main body is preferably made of ceramics. In this case, the workability of the substrate main body is able to be increased.

In a substrate according to another preferred embodiment of the present invention, a first through-hole extending from the first main surface to the second main surface is preferably provided in a region of the substrate main body in which the recessed portion is provided, and a material having a shrinkage which, during firing, is larger than a shrinkage of the substrate main body during the firing is disposed in the first through-hole, or an inside of the first through-hole is empty. In this case, a difference in the shrinkage when the ceramics are fired enables the recessed portion to be readily and accurately provided.

In a substrate according to another preferred embodiment of the present invention, a second through-hole extending from the first main surface to the second main surface of the substrate main body is preferably provided in a region outside the recessed portion, and a material having a shrinkage which, during firing, is less than a shrinkage of the substrate main body during the firing is disposed in the second through-hole. In this case, the presence of the material having less shrinkage in the second through-hole enables the thickness of the substrate main body to be relatively increased at a portion at which the second through-hole is provided.

In a substrate according to another preferred embodiment of the present invention, at least one of the first electrode lands and at least two of the second electrode lands are preferably located on a same straight line in a plan view from the first main surface of the substrate main body, and at least one of the second electrode lands is located on the same straight line on both sides of the at least one of the first electrode lands. In this case, the stray capacitance is able to be decreased on both sides of the at least one of the first electrode lands.

In a substrate according to another preferred embodiment of the present invention, a dimension of the first electrode land in a width direction is preferably equal to or smaller than a dimension of the second electrode land in the width direction where a length direction represents a direction of the same straight line, and the width direction represents a direction perpendicular to the length direction and perpendicular to a thickness direction of the first and second electrode lands. In this case, the effect of the stray capacitance is able to be further decreased.

An elastic wave device according to a preferred embodiment of the present invention includes a substrate according a preferred embodiment of the present invention, and an elastic wave element that is mounted on the first main surface of the substrate main body and that includes metallic bumps bonded to the first electrode land and the second electrode land.

In an elastic wave device according to another preferred embodiment of the present invention, the elastic wave element preferably includes a bonding surface on which the metallic bumps are disposed. A volume of a space connecting an outer circumference of the first electrode land to a projected portion of the outer circumference of the first electrode land on the bonding surface of the elastic wave element is equal or substantially equal to a volume of a space connecting an outer circumference of the second electrode land to a projected portion of the outer circumference of the second electrode land on the bonding surface of the elastic wave element.

A method for manufacturing a substrate according to a preferred embodiment of the present invention is a method for manufacturing a substrate according to a preferred embodiment of the present invention. The method for manufacturing the substrate according to a preferred embodiment of the present invention includes a step of preparing the substrate main body that includes the first main surface including the recessed portion and the second main surface, and a step of forming the first electrode land and the second electrode land on the first main surface of the substrate main body.

In a method for manufacturing a substrate according to another preferred embodiment of the present invention, the step of preparing the substrate main body preferably includes a step of preparing a ceramic plate that includes a pair of facing main surfaces and that is made of unfired ceramics, a step of forming a first through-hole extending between the pair of facing main surfaces in the ceramic plate, and a step of firing the ceramic plate. In this case, the recessed portion is able to be readily formed by firing.

A method for manufacturing a substrate according to another preferred embodiment of the present invention preferably further includes a step of forming a second through-hole extending between the pair of facing main surfaces in a region of the ceramic plate outside a region in which the recessed portion is formed, and a step of disposing, in the second through-hole, a material having a shrinkage which is less than a shrinkage of the ceramics when the ceramics are fired. In this case, a region having a relatively increased thickness outside the recessed portion is able to be readily formed by firing.

In a method for manufacturing a substrate according to another preferred embodiment of the present invention, the step of preparing the substrate main body preferably includes a step of preparing a ceramic plate that includes a pair of facing main surfaces and that is made of unfired ceramics, a step of forming a second through-hole extending between the pair of facing main surfaces in the ceramic plate, a step of disposing, in the second through-hole, a material having a shrinkage which is less than a shrinkage of the ceramics when the ceramics are fired, and a step of firing the ceramic plate. In this case, the region having a relatively increased thickness outside the recessed portion is able to be readily formed by firing in the substrate main body.

Substrates according to various preferred embodiments of the present invention enable distance between first and second electrode lands along a first main surface of a substrate main body to be increased. Accordingly, the stray capacitance is able to be decreased without increasing the size of each of the substrates. Consequently, the size of each of the substrates is also able to be decreased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will hereinafter be described in detail with reference to the drawings to clarify the present invention.

The preferred embodiments are described by way of example in the present disclosure, and features thereof may be partially replaced or combined between different preferred embodiments.

Figure 1A:
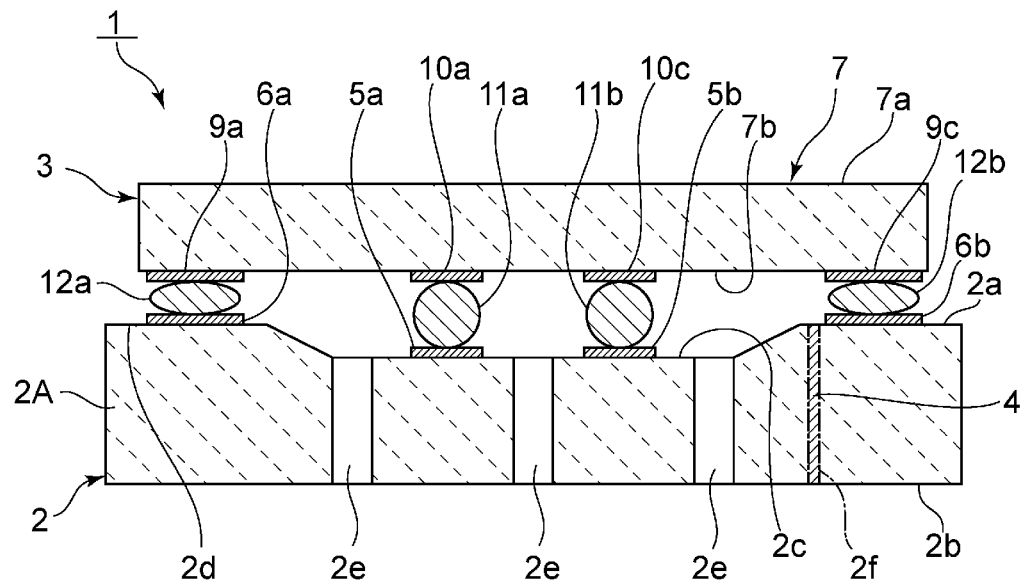
FIGS. 1A and 1B are a sectional front view and a plan view of a surface acoustic wave device in which a surface acoustic wave element is mounted above a substrate according to a first preferred embodiment of the present invention.
Figure 1B:
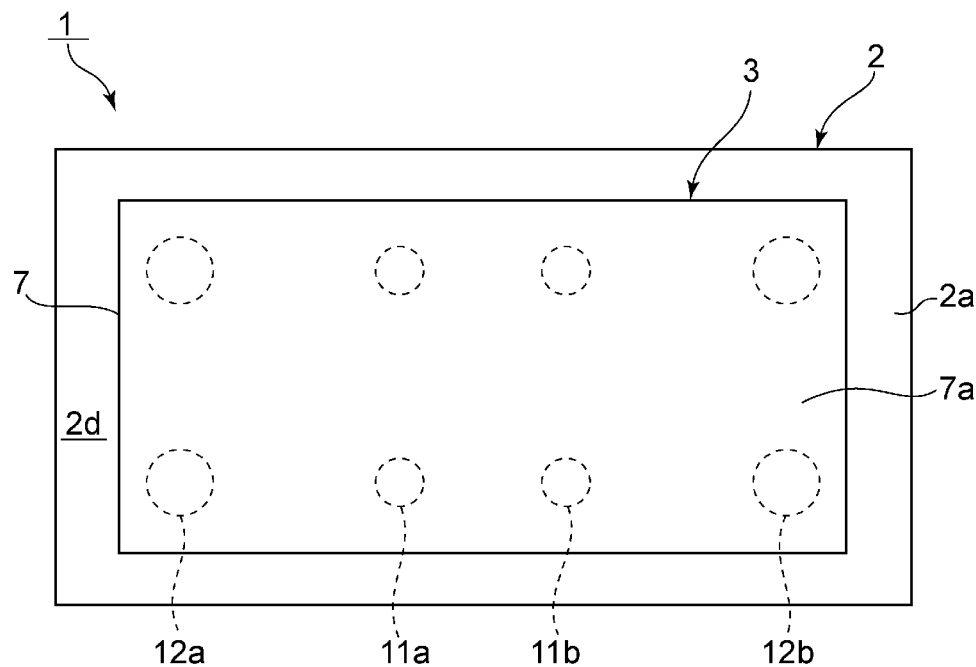

FIGS. 1A and 1B are a sectional front view and a plan view of a surface acoustic wave device according to a first preferred embodiment of the present invention. A surface acoustic wave device 1 includes a substrate 2 according to a preferred embodiment of the present invention. The substrate 2 includes a substrate main body 2A made of an insulating material. Ceramics, such as alumina, are preferably used as the insulating material. In the surface acoustic wave device 1, a surface acoustic wave element 3 is mounted above the substrate 2.

The substrate main body 2A includes a first main surface 2a and a second main surface 2b. The first main surface 2a and the second main surface 2b face each other.

The first main surface 2a includes a recessed portion 2c that opens toward the first main surface 2a. Accordingly, the thickness of the substrate 2 relatively decreases at the recessed portion 2c. The recessed portion 2c is provided in a region inside the outer periphery of the first main surface 2a of the substrate 2. In this case, a region 2d outside the recessed portion is provided outside the recessed portion 2c so as to have a rectangular or substantially rectangular frame shape. The thickness of the region 2d outside the recessed portion is larger than that of a portion at which the recessed portion 2c is provided.

The region 2d outside the recessed portion may have a frame shape other than a rectangular or substantially rectangular frame shape.

The substrate 2 including the recessed portion 2c is structured in a manner in which first through-holes 2e are provided in the portion at which the recessed portion 2c is to be provided. Specifically, when the substrate 2 is manufactured, a flat ceramic-green-sheet multilayer body is prepared as an unfired ceramic plate. Subsequently, through-holes corresponding to the first through-holes 2e are formed by, for example, punching. Subsequently, the unfired ceramic-green-sheet multilayer body is fired. Thus, the substrate main body 2A is obtained.

During firing, portions around which the first through-holes 2e are formed are likely to shrink. For this reason, the thickness of the portions around which the first through-holes 2e are formed relatively decreases. That is, the recessed portion 2c is able to be readily formed.

Second through-holes 2f, one of which is illustrated by a one-dot chain line, may be provided to sufficiently increase the thickness of the region 2d outside the recessed portion. In this case, the second through-holes 2f extend from the first main surface 2a to the second main surface 2b, and a low shrinkage material 4 is filled therein. The low shrinkage material 4 is a material having a shrinkage which, in a firing process to obtain the substrate 2, is less than the shrinkage of the ceramics of which the substrate 2 are formed during firing. A metal, for example, may be used for the low shrinkage material 4. After the unfired ceramic-green-sheet multilayer body is prepared, the second through-holes 2f are formed in a portion at which the region 2d outside the recessed portion is formed, and the low shrinkage material 4 is filled therein. In this way, the region 2d outside the recessed portion, which has a relatively increased thickness after firing, is able to be readily formed.

It is permissible to use at least one structure of the first through-holes 2e and the second through-holes 2f filled with the low shrinkage material 4, one of which is illustrated by the one-dot chain line, or both of these structures.

The inside of the first through-holes 2e may not be empty. For example, a large shrinkage material having a shrinkage which, when the ceramics are fired, is larger than the shrinkage of the ceramics during firing may be filled therein. Also in this case, the thickness of the portions around the first through-holes 2e is able to be relatively decreased.

As illustrated in FIG. 1A, on the first main surface 2a of the substrate main body 2A, first electrode lands 5a and 5b are disposed in the recessed portion 2c, and second electrode lands 6a and 6b are disposed in the region 2d outside the recessed portion. The first electrode lands 5a and 5b and the second electrode lands 6a and 6b are each made of an appropriate metal or alloy and, according to the present preferred embodiment, are each preferably made of a layer of tungsten, nickel, and aurum, for example.

The first electrode lands 5a and 5b and the second electrode lands 6a and 6b are connected to different electric potentials.

Figure 3:
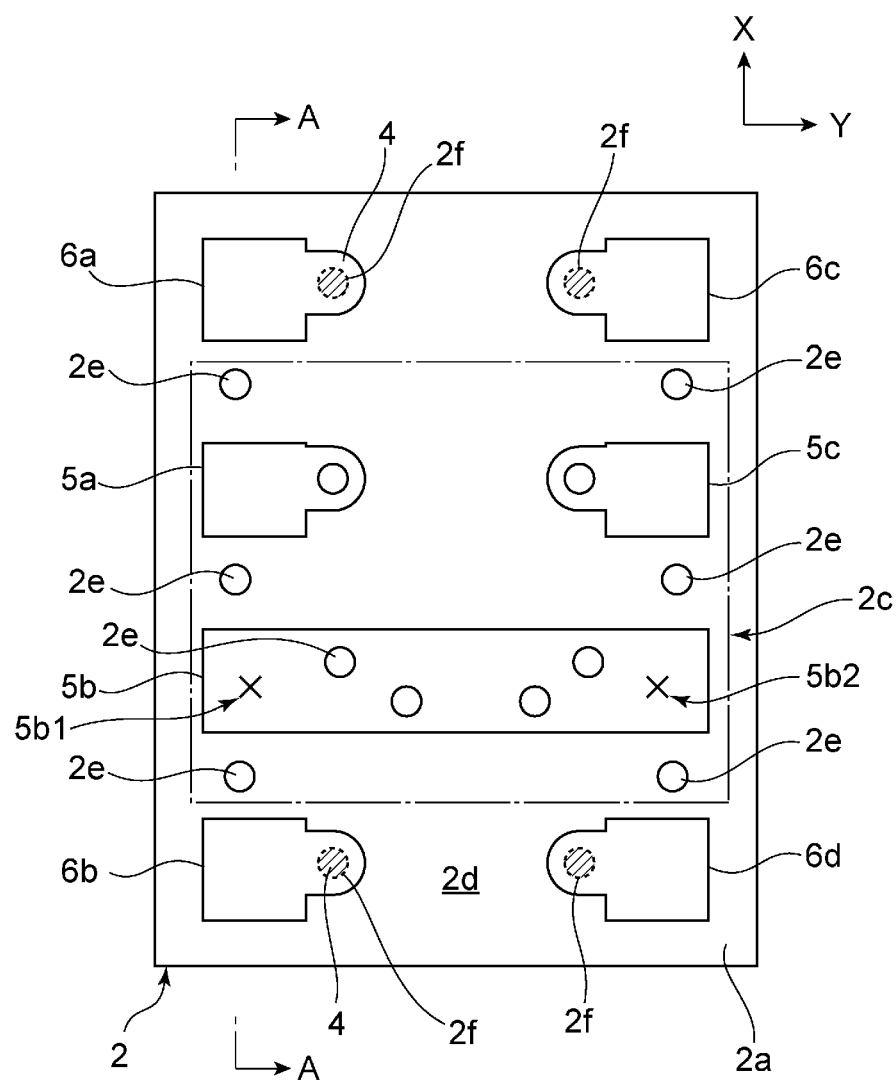
FIG. 3 is a plan view of the substrate according to the first preferred embodiment of the present invention.

More specifically, as illustrated in a plan view in FIG. 3, the first electrode lands 5a to 5c and the second electrode lands 6a to 6d are disposed on the first main surface 2a of the substrate 2. FIG. 1A illustrates a portion corresponding to a section along line A-A in FIG. 3. The direction of the one-dot chain line A-A is referred to as the X-direction, and the direction that is perpendicular to the X-direction and parallel to the first main surface 2a of the substrate 2 is referred to as the Y-direction. The first electrode land 5c and the first electrode land 5a are arranged in the Y-direction so as to define a pair. The second electrode lands 6a and 6b and the second electrode lands 6c and 6d are arranged in the Y-direction so as to define pairs. The first electrode land 5b extends in the Y-direction and is preferably rectangular or substantially rectangular. Thus, the electrode land arrangement on one side is symmetric with the electrode land arrangement on the other side with respect to the central line that passes through the center of the substrate 2 in the Y-direction and that extends in X-direction.

In FIG. 3, the outer periphery of the recessed portion 2c is illustrated by a one-dot chain line. The first through-holes 2e are provided in the portion at which the recessed portion 2c is provided. Thus, the thickness of the substrate 2 relatively decreases. The second through-holes 2f are provided in the region 2d outside the recessed portion at the second electrode lands 6a to 6d. The second through-holes 2f are filled with the low shrinkage material 4 described above.

The surface acoustic wave element 3 (see FIG. 1A) is mounted above the first electrode lands 5a to 5c and the second electrode lands 6a to 6d with metallic bumps interposed therebetween.

The surface acoustic wave element 3 illustrated in FIG. 1A includes a piezoelectric substrate 7. The piezoelectric substrate 7 is preferably made of piezoelectric single crystal such as $LiTaO_3$ or $LiNbO_3$, for example. The piezoelectric substrate 7 may be made of piezoelectric ceramics.

Figure 2:
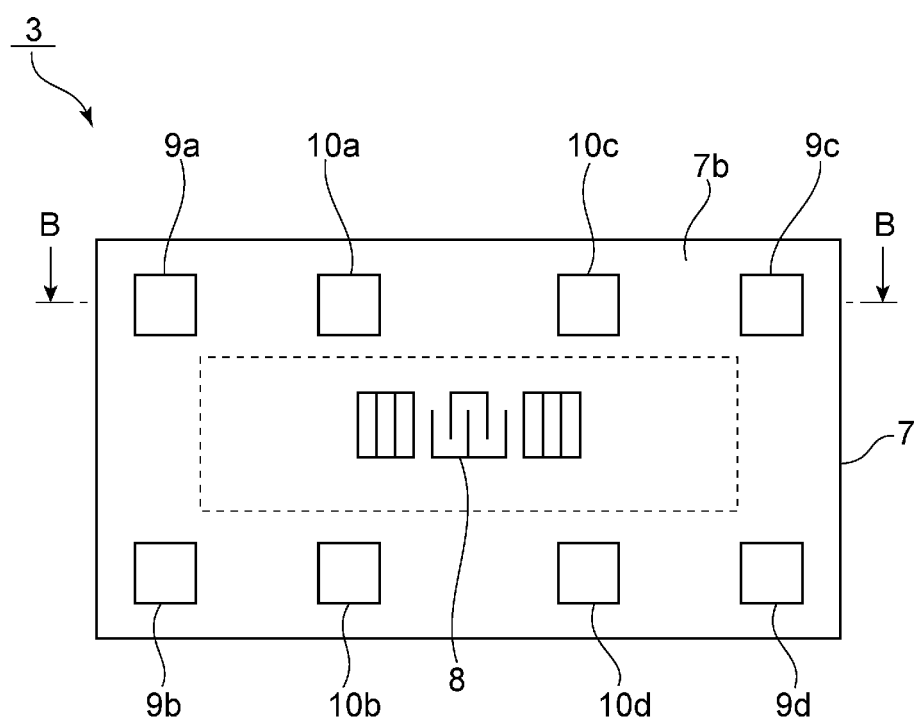
FIG. 2 is a schematic bottom view of the structure of an electrode of the surface acoustic wave element used according to the first preferred embodiment of the present invention.

The piezoelectric substrate 7 includes a first main surface 7a and a second main surface 7b facing the first main surface 7a. The second main surface 7b faces the first main surface 2a of the substrate 2. That is, the surface acoustic wave element 3 is mounted above the substrate 2 from the side of the second main surface 7b. FIG. 2 is a schematic bottom view of the structure of an electrode disposed on the second main surface 7b.

A functional electrode including an interdigital transducer electrode 8 is disposed in a region surrounded by a dashed line. Signal-side terminals 9a to 9d and ground-side terminals 10a to 10d connected to a ground potential are disposed therearound so as to be electrically connected to the functional electrode.

FIG. 1A illustrates a section corresponding to a portion on which the signal-side terminals 9a and 9c and the ground-side terminals 10a and 10c are disposed, that is, the portion corresponding to a section along line B-B in FIG. 2.

As illustrated in FIG. 1A, the first electrode lands 5a and 5b are bonded to the ground-side terminals 10a and 10c using first metallic bumps 11a and 11b, respectively. The second electrode lands 6a and 6b are bonded to the signal-side terminals 9a and 9c using second metallic bumps 12a and 12b, respectively.

The first metallic bumps 11a and 11b and the second metallic bumps 12a and 12b are each made of an appropriate metal. According to the present preferred embodiment, Au bumps are preferably used, but the present preferred embodiment is not particularly limited thereto.

The signal-side terminals 9a to 9d and the ground-side terminals 10a to 10d that are disposed on the surface acoustic wave element 3 are each made of an appropriate metal or alloy. According to the present preferred embodiment, a layer of tungsten, nickel, and aurum is preferably used as a metallic material.

The first metallic bumps 11a and 11b and the second metallic bumps 12a and 12b are disposed on the side of the surface acoustic wave element 3 in advance. During bonding, the first metallic bumps 11a and 11b and the second metallic bumps 12a and 12b are pressed against the first electrode lands 5a and 5b and the second electrode lands 6a and 6b and bonded while ultrasonic waves are applied. According to the present preferred embodiment, since the recessed portion 2c is provided, the height of the second electrode lands 6a and 6b is more than the height of the first electrode lands 5a and 5b. For this reason, as illustrated, the second metallic bumps 12a and 12b are crushed during bonding by being pressed and subjected to a pressure higher than in the case of the first metallic bumps 11a and 11b and extend to the lateral direction. Accordingly, the plane area of the first metallic bumps 11a and 11b after bonding is smaller than the plane area of the second metallic bumps 12a and 12b after bonding as the planar shapes of the metallic bumps after bonding are schematically illustrated by dashed lines in FIG. 1B. For this reason, the area of the first electrode lands 5a and 5b is smaller than the area of the second electrode lands 6a and 6b. However, the first electrode lands 5a and 5b are able to be bonded with a sufficient bonding strength by using the first metallic bumps 11a and 11b.

In addition, since the height of the first electrode land 5a differs from the height of the second electrode land 6a, the distance between the first electrode land 5a and the second electrode land 6a along a surface of the substrate 2 is longer than in the case where the adjacent electrode lands are coplanar and have the same height position. Accordingly, although the first electrode land 5a and the second electrode land 6a are connected to different electric potentials, the stray capacitance between the two is able to be decreased. For example, the resonance characteristic and the filter characteristic of the surface acoustic wave device 1 are, thus, unlikely to be degraded.

According to a preferred embodiment of the present invention, the recessed portion 2c is provided inside the outer periphery of the substrate 2. In this case, the above region 2d that is not recessed and preferably has a rectangular or substantially rectangular frame shape is provided between the recessed portion 2c and the outer periphery of the substrate 2. In the case where the second electrode lands 6a to 6d are, thus, disposed on an outer side portion, a large bonding pressure of each bump is applied to the second electrode lands 6a to 6d, and the bonding strength between an outer peripheral region of the substrate 2 and an electronic component element is able to be effectively increased.

The area of the first electrode land 5a is preferably smaller than the area of the second electrode land 6a. This enables the stray capacitance between the first electrode land 5a and the second electrode land 6a to be further decreased.

According to a preferred embodiment of the present invention, at least one of the first electrode lands 5a and 5b and at least two of the second electrode lands 6a and 6b are located on the same straight line. At least one of the second electrode lands 6a and 6b is located on the same straight line on both sides of the at least one of the first electrode lands 5a and 5b. Accordingly, the stray capacitance between the first electrode land 5a and the second electrode land 6a and the stray capacitance between the first electrode land 5b and the second electrode land 6b are able to be sufficiently decreased. In other words, the stray capacitance is able to be decreased on the same straight line on both sides of a portion at which the at least one of the first electrode lands 5a and 5b is disposed.

The direction of the same straight line is referred to as a length direction, and the direction that is perpendicular to the length direction and that is perpendicular to the thickness direction of the first and second electrode lands 5a, 5b, 6a, and 6b is referred to as a width direction. The dimension of the first electrode lands 5a and 5b in the width direction is preferably equal to or smaller than the dimension of the second electrode lands 6a and 6b in the width direction. This enables the stray capacitance between the first electrode land 5a and the second electrode land 6a and the stray capacitance between the first electrode land 5b and the second electrode land 6b to be further decreased. The reason for this decrease is that the length of electrode edge portions that face each other between the first electrode lands 5a and 5b and the second electrode lands 6a and 6b is able to be decreased.

The number of the second through-holes is preferably larger than the number of the first through-holes. In this case, the region having a relatively increased thickness outside the recessed portion is able to be effectively provided in the substrate main body with certainty.

The distance between each second electrode land and a corresponding one of the second through-holes in the region 2d outside the recessed portion is preferably shorter than the distance between each first electrode land and a corresponding one of the first through-holes in the recessed portion 2c. In this case, the region having a relatively increased thickness outside the recessed portion is able to be provided with certainty.

In the case where the first and second through-holes are each provided in a plurality, the following relationship is preferably satisfied. That is, the number of the second through-holes having distances to the second electrode lands that are equal to or shorter than the average distance is preferably larger than the number of the first through-holes having distances to the first electrode lands that are equal to or shorter than the average distance. In this case, the stray capacitance is able to be more effectively decreased.

The second main surface 7b of the piezoelectric substrate 7 is a bonding surface for the bumps. The first and second electrode lands are preferably bonded to the electronic component element using an equal amounts of the bumps. In this case, a process of providing the bumps in manufacturing processes is able to be simplified. In this case, it is preferable that the volume of a space connecting the outer circumference of each second electrode land to a projected portion of the outer circumference of the second electrode land on the second main surface 7b of the piezoelectric substrate 7 be equal or substantially equal to the volume of a space connecting the outer circumference of each first electrode land to a projected portion of the outer circumference of the first electrode land on the second main surface 7b of the piezoelectric substrate 7. In this case, the volume of a space in which each bump is disposed is constant or substantially constant, and the bump is unlikely to excessively extend in the lateral direction even when there is a difference in the height between the first electrode lands and the second electrode lands.

It is preferable that $S1/S2 \geq L2/L1$ is satisfied, where S1 represents the area of each first electrode land, S2 represents the area of each second electrode land, L1 represents the distance from the first electrode land to the second main surface 7b of the piezoelectric substrate 7, and L2 represents the distance from the second electrode land to the second main surface 7b of the piezoelectric substrate 7. In this case, the volume of the space in which each metallic bump is disposed is constant or substantially constant, and the bump is unlikely to excessively extend in the lateral direction even when there is a difference in the height between the first electrode lands and the second electrode lands.

Figure 4:
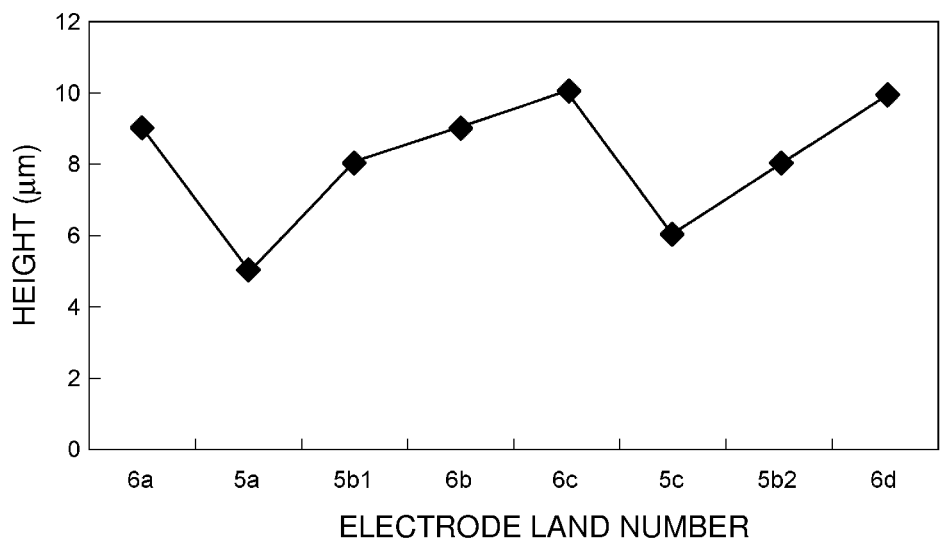
FIG. 4 illustrates the relationship between the height of the electrode and the position of first and second electrode lands or an electrode land on a substrate according to an experimental example.

FIG. 4 illustrates the relationship between the height of the electrode and the position of the first and second electrode lands or an electrode land on the substrate 2. The height of the electrode corresponds to the height of the upper surface of each electrode land. The film thickness of each electrode land preferably is about 7.5 µm, for example. Accordingly, a height of 0 µm of the electrode in FIG. 4 corresponds to the height position of the inner bottom surface of the recessed portion 2c of the substrate 2. Each height difference of the first electrode land 5a and the first electrode land 5c is caused by a variation in the thickness of the electrode.

The height position of the first electrode land 5b that is illustrated is the height position at a position 5b1 and a position 5b2 illustrated by X marks in FIG. 3. The actual height at the position 5b1 and the position 5b2 differs from that in FIG. 1A and is higher than the height of the first electrode land 5a.

As illustrated in FIG. 4, the height position of the second electrode lands 6a to 6d is preferably a high position of about 8 µm or more, for example.

According to a preferred embodiment of the present invention, the diameter of the Au bumps preferably is about 80 µm before bonding, for example. The dimension of each second electrode land preferably is about 240 µm×about 240 µm, and the dimension of each first electrode land preferably is about 240 µm×about 215 µm, for example.

Interdigital transducer electrodes, a reflector, and others as a functional electrode, for example, are provided to define a duplexer. The isolation characteristics of the duplexer are illustrated by a solid line in FIG. 5. The result of a comparative example is illustrated by a dashed line. In the comparative example, a duplexer is manufactured in the same or substantially the same manner as a preferred embodiment except that a substrate does not include a recessed portion, and all electrode lands are located at the same height position.

Figure 5:
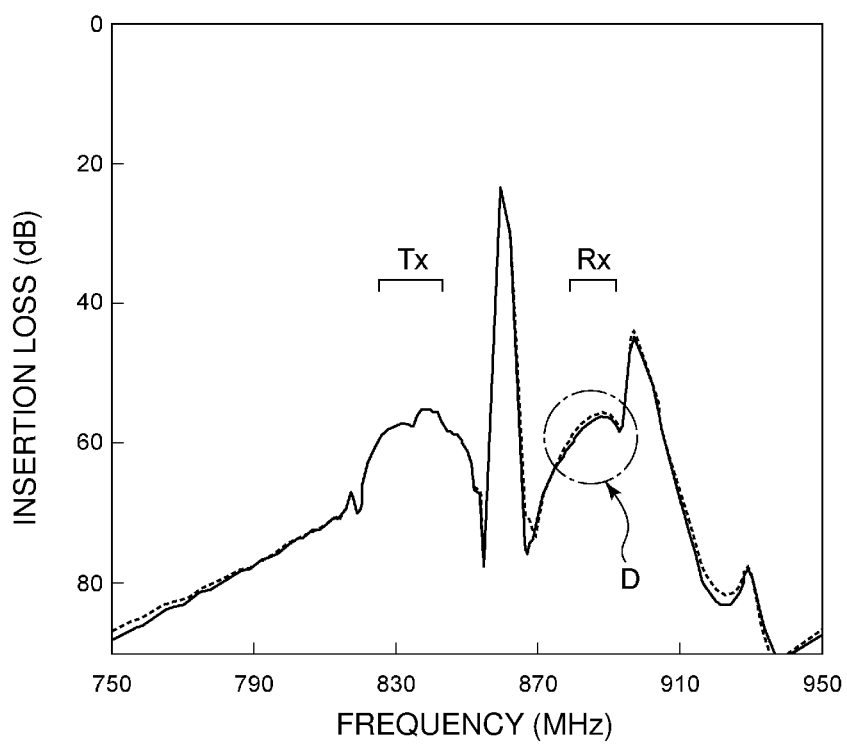
FIG. 5 illustrates isolation characteristics of a surface acoustic wave filter prepared in an experimental example according to the first preferred embodiment of the present invention.
Figure 6:
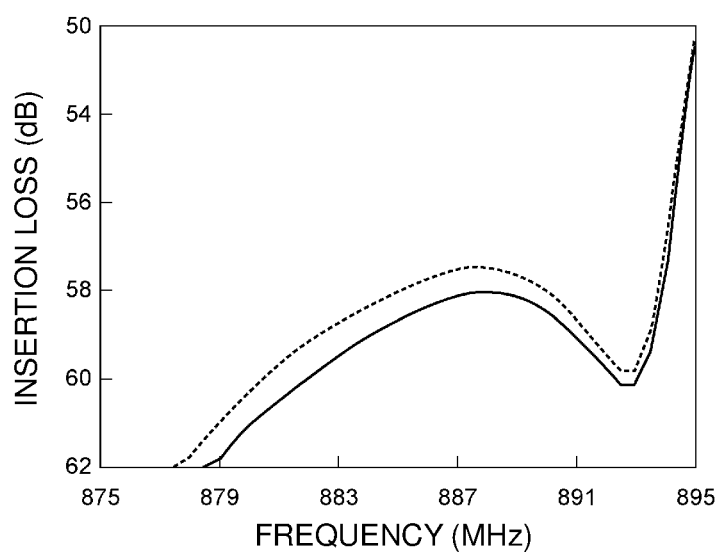
FIG. 6 is an enlarged view of a portion of a one-dot chain line D illustrated in FIG. 5.

In FIG. 5, Tx represents a transmission band, and Rx represents a reception band. As is clear from FIG. 5 and FIG. 6 illustrating an enlarged portion surrounded by the one-dot chain line D in FIG. 5, according to a preferred embodiment, the isolation characteristics in the reception band are greatly improved than in the case of the comparative example. The reason is presumably that the stray capacitance decreases.

Although an example of a duplexer is described according to a preferred embodiment of the present invention, preferred embodiments of the present invention are not limited to the duplexer and may be used for various elastic wave devices. The substrates according to preferred embodiments of the present invention are not limited to an elastic wave device and may be widely used for various electronic components in which electronic component elements are bonded to substrates by using metallic bumps.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component device comprising:
    a substrate main body that includes a first main surface including a recessed portion, and a second main surface facing the first main surface;
    an electronic component element mounted on the substrate main body and including a first main surface and a second main surface that opposes the first main surface of the substrate main body;
    at least one first electrode land disposed inside the recessed portion of the first main surface of the substrate main body;
    at least one second electrode land disposed on the first main surface of the substrate main body outside the recessed portion and that is connected to an electric potential different from an electric potential of the at least one first electrode land; and
    a plurality of terminals disposed on the second main surface of the electronic component element and respectively connected to the at least one first electrode land and the at least one second electrode land.

2. The electronic component device according to claim 1, wherein the substrate main body is a multilayer substrate including a plurality of substrate layers.

3. The electronic component device according to claim 1, wherein the recessed portion is provided inside an outer periphery of the substrate, and a region that is not recessed is provided between the recessed portion and the outer periphery.

4. The electronic component device according to claim 3, wherein the region that is not recessed has a rectangular or substantially rectangular frame shape.

5. The electronic component device according to claim 1, wherein an area of the at least one first electrode land is smaller than an area of the at least one second electrode land.

6. The electronic component device according to claim 1, wherein the substrate main body is made of ceramics.

7. The electronic component device according to claim 6, wherein a first through-hole extending from the first main surface to the second main surface is provided in a region of the substrate main body in which the recessed portion is provided, and a material having a shrinkage which, during firing, is larger than a shrinkage of the substrate main body during the firing is disposed in the first through-hole, or an inside of the first through-hole is empty.

8. The electronic component device according to claim 6, wherein a second through-hole extending from the first main surface to the second main surface of the substrate main body is provided in a region outside the recessed portion, and a material having a shrinkage which, during firing, is less than a shrinkage of the substrate main body during the firing is disposed in the second through-hole.

9. The electronic component device according to claim 1, wherein
    the at least one second electrode land includes a plurality of second electrode lands; and
    at least one of the at least one first electrode land& and at least two of the plurality of second electrode lands are located on a same straight line in a plan view from the first main surface of the substrate main body, and at least one of the plurality of second electrode lands is located on the same straight line on both sides of the at least one of the at least one first electrode land.

10. The electronic component device according to claim 9, wherein a dimension of the at least one first electrode land in a width direction is equal to or smaller than a dimension of the at least one second electrode land in the width direction where a length direction represents a direction of the same straight line, and the width direction represents a direction perpendicular to the length direction and perpendicular to a thickness direction of the first and second electrode lands.

11. The electronic component device according to claim 1, wherein
the at least one first electrode land includes a plurality of first electrode lands; and
the at least one second electrode land includes a plurality of second electrode lands.

12. An elastic wave device, comprising:
a substrate main body that includes a first main surface including a recessed portion, and a second main surface facing the first main surface;
at least one first electrode land disposed inside the recessed portion of the first main surface of the substrate main body;
at least one second electrode land disposed on the first main surface of the substrate main body outside the recessed portion and that is connected to an electric potential different from an electric potential of the at least one first electrode land; and
an elastic wave element mounted above the first main surface of the substrate main body; the elastic wave element including:
a first main surface;
a second main surface that opposes the first main surface of the substrate main body; and
a plurality of metallic bumps disposed on the second main surface of the elastic wave element and respectively bonded to the at least one first electrode land and the at least one second electrode land.

13. The elastic wave device according to claim 12, wherein
the second main surface of the elastic wave element defines a bonding surface on which the plurality of metallic bumps are disposed; and
a volume of a space connecting an outer circumference of the at least one first electrode land to a projected portion of the outer circumference of the at least one first electrode land on the bonding surface of the elastic wave element is equal or substantially equal to a volume of a space connecting an outer circumference of the at least one second electrode land to a projected portion of the outer circumference of the at least one second electrode land on the bonding surface of the elastic wave element.

14. The elastic wave device according to claim 12, wherein the elastic wave element is a surface acoustic wave element.

15. The elastic wave device according to claim 14, wherein the surface acoustic wave element includes a piezoelectric substrate made of $LiTaO_3$ or $LiNbO_3$.

16. A substrate comprising:
a substrate main body that includes a first main surface including a recessed portion, and a second main surface facing the first main surface;
a first electrode land disposed inside the recessed portion of the first main surface of the substrate main body; and
a second electrode land disposed on the first main surface of the substrate main body outside the recessed portion and that is connected to an electric potential different from an electric potential of the first electrode land; wherein
the substrate main body is made of ceramics; and
a first through-hole extending from the first main surface to the second main surface is provided in a region of the substrate main body in which the recessed portion is provided, and a material having a shrinkage which, during firing, is larger than a shrinkage of the substrate main body during the firing is disposed in the first through-hole, or an inside of the first through-hole is empty.

17. A method for manufacturing the substrate according to claim 16, comprising:
preparing the substrate main body that includes the first main surface including the recessed portion, and the second main surface; and
forming the first electrode land and the second electrode land on the first main surface of the substrate main body.

18. The method for manufacturing the substrate according to claim 17, wherein
the preparing the substrate main body includes:
preparing a ceramic plate that includes a pair of facing main surfaces and that is made of unfired ceramics;
forming a first through-hole extending between the pair of facing main surfaces in the ceramic plate; and
firing the ceramic plate.

19. The method for manufacturing the substrate according to claim 18, further comprising:
forming a second through-hole extending between the pair of facing main surfaces in a region of the ceramic plate outside a region in which the recessed portion is formed; and
disposing, in the second through-hole, a material having a shrinkage which is less than a shrinkage of the ceramics when the ceramics are fired.

20. The method for manufacturing the substrate according to claim 17, wherein
the preparing the substrate main body includes:
preparing a ceramic plate that includes a pair of facing main surfaces and that is made of unfired ceramics;
forming a second through-hole extending between the pair of facing main surfaces in the ceramic plate;
disposing, in the second through-hole, a material having a shrinkage which is less than a shrinkage of the ceramics when the ceramics are fired, and
firing the ceramic plate.

* * * * *